United States Patent [19]

Kurisaki et al.

[11] Patent Number: 5,814,735
[45] Date of Patent: Sep. 29, 1998

[54] FLOW RATE DETECTOR

[75] Inventors: Shogo Kurisaki; Takashi Takebayashi; Ge Pinghou; Tomonobu Endou, all of Ibaraki-ken, Japan

[73] Assignee: SMC Kabushiki Kaisha, Tokyo, Japan

[21] Appl. No.: 716,522

[22] Filed: Sep. 19, 1996

[30] Foreign Application Priority Data

Sep. 25, 1995 [JP] Japan .................................. 7-246518

[51] Int. Cl.⁶ ...................................................... G01F 1/32
[52] U.S. Cl. ...................................................... 73/861.22
[58] Field of Search ........................... 73/861.19, 861.21, 73/861.22

[56] References Cited

U.S. PATENT DOCUMENTS

| | | | |
|---|---|---|---|
| 4,878,386 | 11/1989 | Isobe et al. | 73/861.22 |
| 4,977,781 | 12/1990 | Misumi et al. | 73/861.22 |
| 4,984,470 | 1/1991 | Hayward et al. | 73/861.22 |
| 5,347,873 | 9/1994 | Vander Hayden | 73/861.22 |

FOREIGN PATENT DOCUMENTS

| | | |
|---|---|---|
| 0 666 468 | 8/1995 | European Pat. Off. . |
| 23 42 559 | 9/1982 | Germany . |
| 32 39 126 | 5/1983 | Germany . |
| 39 22 403 | 1/1990 | Germany . |
| 40 17 473 A1 | 11/1991 | Germany . |
| 38 17 852 C2 | 10/1992 | Germany . |

OTHER PUBLICATIONS

"The flow and level" Handbook by Omega, vol. 29, pp. –G–4, M–3, 8, 30, 1995.
Messen, Steuern, Regeln msr, vol. 31, pp. 228–231, 1988, K. Schilder, "Wirbel–Durchflussmesser Für Die Automatisierungstechnik".
"The Flow and Level" Handbook by Omega, pp. G–15 and G–16. Copyright 1995.
"The Temperature" Handbok by Omega, pp. P–20 and P–30. Copyright 1995.

Primary Examiner—Ronald L. Biegel
Assistant Examiner—Harshad Patel
Attorney, Agent, or Firm—Oblon, Spivak, McClelland, Maier & Neustadt, P.C.

[57] ABSTRACT

A threshold value is stored in a CPU using setting switches. When a fluid is introduced into a flow passage, a rod disposed in the flow passage sheds Kármán vortexes downstream thereof in the fluid as it flows through the flow passage. A piezoelectric device generates an electric signal depending on pressure fluctuations of the Kármán vortexes, and the electric signal is applied through a comparator to the CPU. The CPU refers to a data table stored in a memory to determine a flow rate of the fluid based on the period of the electric signal. When the determined flow rate is greater than the threshold value, the CPU turns on transistors to energize loads as external devices. When the determined flow rate is smaller than the threshold value, the CPU turns off transistors to de-energize loads.

10 Claims, 7 Drawing Sheets

FLOW RATE DETECTOR

BACKGROUND OF THE INVENTION

1. Field of the Invention

The present invention relates to a flow rate detector for measuring the flow rate of a fluid which is introduced into a fluid passage.

2. Description of the Related Art

The existence of a rod in a fluid flowing through a flow passage sheds Kármán vortexes downstream of the rod in the fluid flow. There has been known a conventional flow rate detector for measuring the speed of a fluid flow in a flow passage based on periodic fluctuations of Kármán vortexes shed in the wake of a rod placed in the fluid flow, and calculating the flow rate of the fluid based on the measured speed of the fluid flow and the cross-sectional area of the flow passage.

The conventional flow rate detector, however, has no means for controlling an external device depending on the calculated flow rate, and has failed to automatically operate a desired external device when the flow rate of the fluid flowing through the flow passage is greater or smaller than a predetermined flow rate.

SUMMARY OF THE INVENTION

It is a general object of the present invention to provide a flow rate detector which is capable of controlling another device depending on the flow rate of a fluid which is detected thereby.

A primary object of the present invention is to provide a flow rate detector which is capable of determining the flow rate of a fluid flowing in a flow passage by detecting Kármán vortexes shed in the fluid and of displaying the determined flow rate.

Another object of the present invention is to provide a flow rate detector which measures, with a pressure sensor, periodic fluctuations of Kármán vortexes shed in the flow of a fluid in a flow passage by a rod positioned in the fluid flow, calculates the flow rate of the fluid from the measured periodic fluctuations with a processing circuit, displays the calculated flow rate on a display means, converts the result of a comparison between the calculated flow rate and a reference flow rate preset by a setting means into an electric signal, and outputs the electric signal to a signal output means for thereby controlling an external device based on the result of the comparison.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
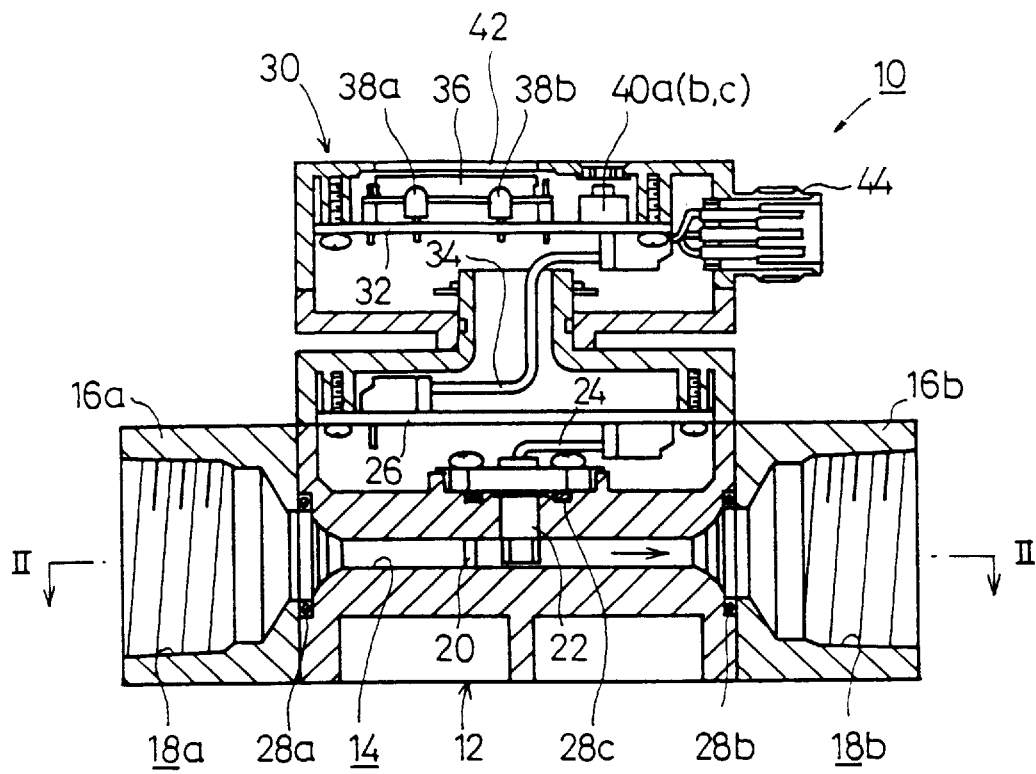
FIG. 1 is a longitudinal cross-sectional view of a flow rate detector according to a first embodiment of the present invention.

As shown in FIG. 1, a flow rate detector 10 according to a first embodiment of the present invention includes an elongate casing 12 having a flow passage 14 of a substantially square cross-sectional shape defined longitudinally therein for passage of a fluid therethrough. The flow rate detector 10 also includes a pair of pipe connectors 16a, 16b mounted respectively on opposite ends of the casing 12 and having respective holes 18a, 18b defined therein in communication with the flow passage 14. The pipe connectors 16a, 16b have respective internally threaded surfaces which define the respective holes 18a, 18b, for connection to fluid inlet and outlet pipes, respectively.

Figure 2:
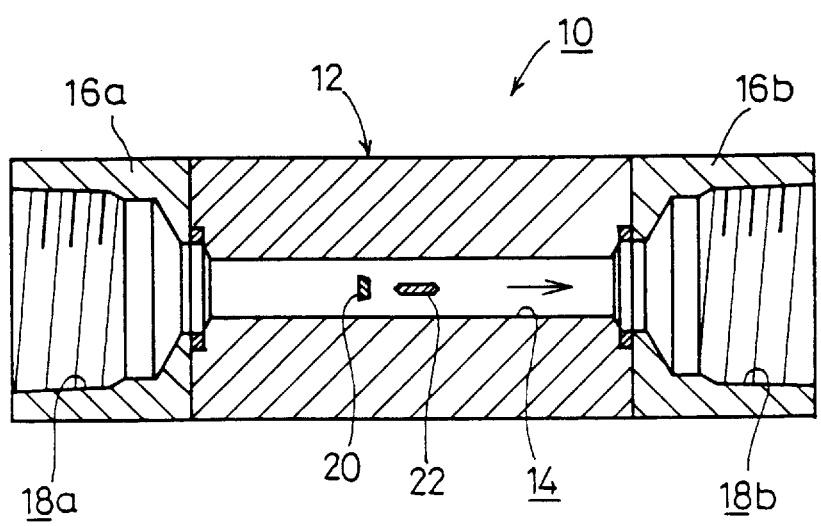
FIG. 2 is a cross-sectional view taken along line II—II of FIG. 1.

A rod 20 for shedding Kármán vortexes downstream thereof in a fluid flow in the flow passage 14 is disposed substantially centrally, for example, in the flow passage 14 and extends perpendicularly to the flow passage 14. As shown in FIG. 2, the rod 20 is of a trapezoidal cross section for shedding Kármán vortexes with ease and is oriented such that its longer side is positioned upstream in the flow passage 14 and extends perpendicularly to the fluid flow in the flow passage 14 and its shorter side is positioned downstream in the flow passage 14. A piezoelectric device 22 which serves as a pressure sensor is fixedly mounted in the casing 12 downstream of the rod 20 substantially centrally in the flow passage 14 and partly projects into the flow passage 14. The piezoelectric device 22 has a thin cross-sectional shape extending longitudinally parallel to the flow passage 14, and hence can easily be flexed by Kármán vortexes shed in the wake of the rod 20. Therefore, Kármán vortexes shed in the fluid flow can be detected with increased efficiency by the piezoelectric device 22. The thin cross-sectional shape of the piezoelectric device 22 has wedge-shaped opposite ends spaced along the fluid flow so that the piezoelectric device 22 will not disturb or block the fluid flow in the flow passage 14. Leads 24 connected to the piezoelectric device 22 are connected to a circuit board 26 disposed in the casing 12.

The pipe connectors 16a, 16b are connected to the respective opposite ends of the casing 12 through respective O-rings 28a, 28b for preventing the fluid from leaking out of the casing 12, and the piezoelectric device 22 is mounted in the casing 12 through an O-ring 28c for preventing the fluid from leaking out along the piezoelectric device 22.

Figure 3:
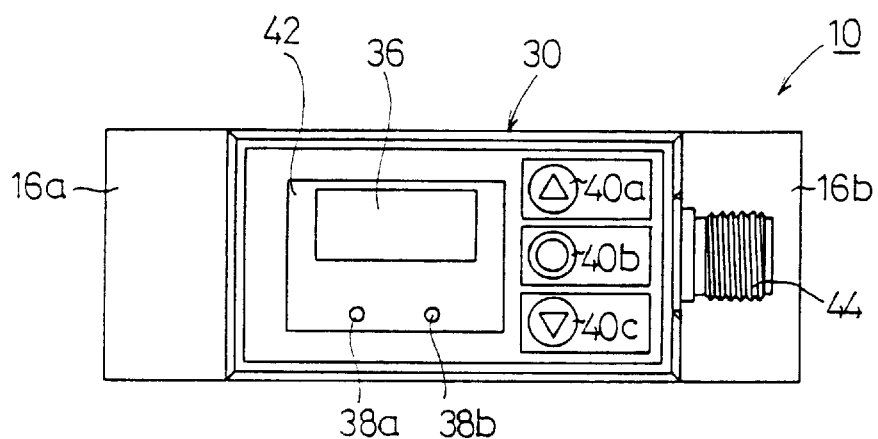
FIG. 3 is a plan view of the flow rate detector shown in FIG. 1.

A display unit 30 is fixed to an upper portion of the casing 12 and includes a circuit board 32 which is electrically connected to the circuit board 26 by leads 34. The circuit board 32 supports thereon a seven-segment LED (light-emitting diode) 36 capable of displaying a three-figure numeral, a pair of LEDs 38a, 38b, and setting switches 40a~40c serving as a setting means for establishing a reference flow rate. As shown in FIG. 3, the seven-segment LED 36 and the LEDs 28a, 28b are positioned so as to be visible from above the display unit 30 through a display window 42. The setting switches 40a~40c can be pressed from above the display unit 30. A connector 44 for outputting signals is electrically connected to the circuit board 32 and mechanically fixed to a wall of the display unit 30.

Figure 4:
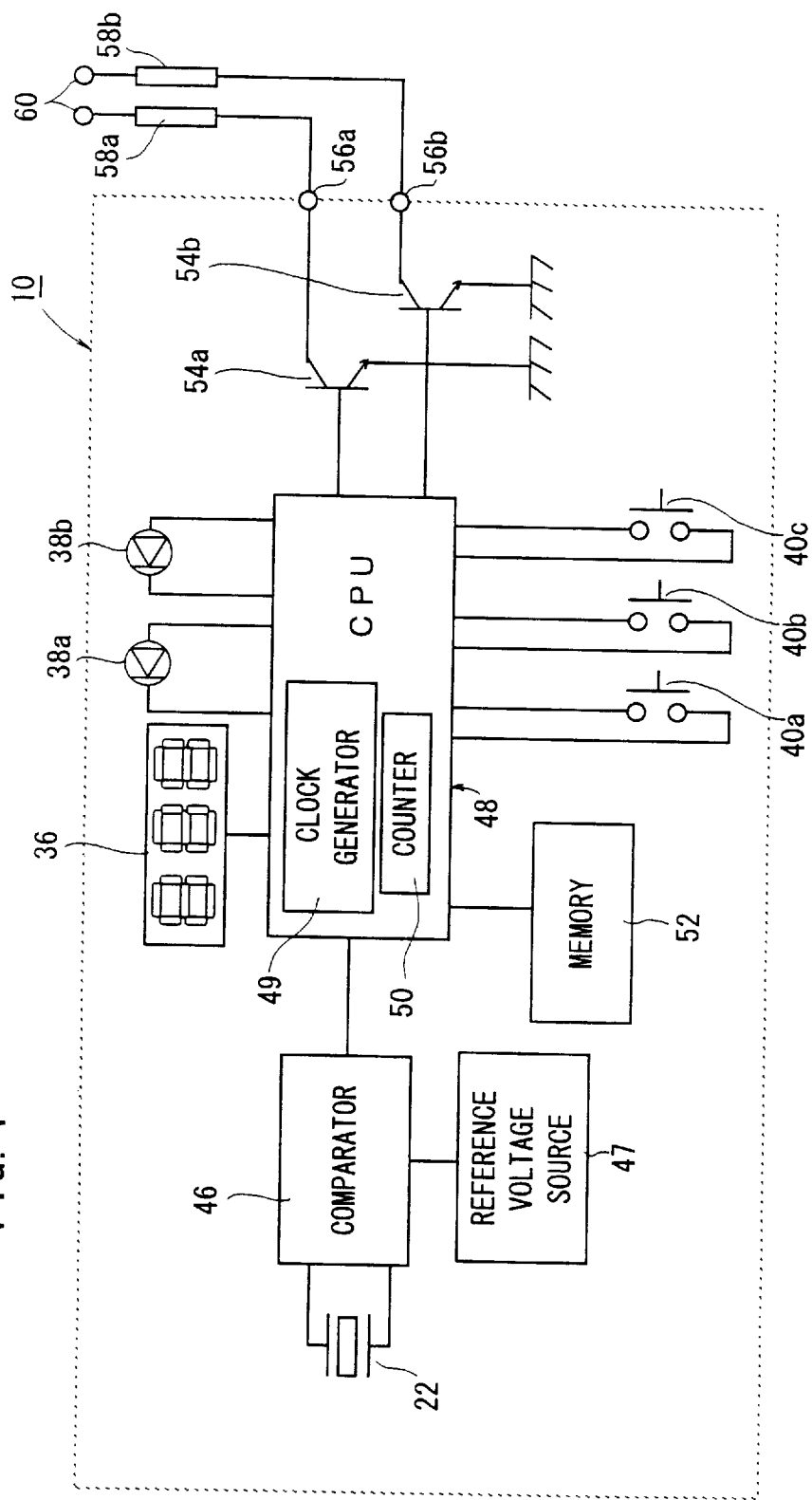
FIG. 4 is a block diagram of an electric circuit of the flow rate detector shown in FIG. 1.

FIG. 4 shows in block form an electric circuit of the flow rate detector 10. As shown in FIG. 4, the piezoelectric device 22 supplies its output signal to a comparator 46 which compares the output signal from the piezoelectric device 22 with a reference voltage generated by a reference voltage source 47. When the output signal from the piezoelectric device 22 is higher than the reference voltage, the comparator 46 outputs a signal representative of "1" (high level). When the output signal from the piezoelectric device 22 is lower than the reference voltage, the comparator 46 outputs a signal representative of "0" (low level). Therefore, the comparator 46 converts the output signal from the piezoelectric device 22 into a binary pulse signal representative of "1" or "0". The binary pulse signal from the comparator 46 is supplied to a CPU (central processing unit) 48. The CPU 48 has a clock generator 49 for generating clock pulses at given periodic cycles, and a counter 50 for counting the clock pulses generated by the clock generator 49. To the CPU 48, there is connected a memory 52 which stores a data table (see FIG. 5) representing the relationship between the frequency F of the pulse signal from the comparator 46 and the flow rate Q of a fluid flow in the flow passage 14. The seven-segment LED 36, the LEDs 28a, 28b, and the setting switches 40a~40c are connected to the CPU 48. The CPU 48 applies output signals to the bases of transistors 54a, 54b whose collectors are connected to respective output terminals 56a, 56b of the connector 44. The comparator 46, the CPU 48, the memory 52, and the transistors 54a, 54b are mounted on either the circuit board 26 or the circuit board 32. When the flow rate detector 10 is used to control loads 58a, 58b as external devices, respective terminals of the loads 58a, 58b are connected to the output terminals 56a, 56b, respectively, and other terminals of the loads 58a, 58b are connected to a power supply 60.

The number of the loads 58a, 58b as external devices varies depending on the number of the transistors 54a, 54b and the number of the output terminals 56a, 56b. In the illustrated first embodiment, since there are two transistors 54a, 54b and two output terminals 56a, 56b, two loads 58a, 58b as external devices may be connected to the flow rate detector 10.

Operation of the flow rate detector 10 will be described below.

At a preparatory stage, two threshold values (reference flow rate values) Qa, Qb corresponding to the two external devices (loads 58a, 58b) are stored in the CPU 48 using the setting switches 40a~40c.

When a fluid such as water or oil is introduced from the fluid inlet pipe into the flow rate detector 10, the fluid flows successively through the hole 18a, the flow passage 14, and the hole 18b into the fluid outlet pipe. The rod 20 sheds Kármán vortexes downstream thereof in the fluid as it flows through the flow passage 14 due to frictional forces imposed on the fluid by the rod 20, and the generated Kármán vortexes move downstream in the flow passage 14. When the Kármán vortexes flow in the vicinity of the piezoelectric device 22, the piezoelectric device 22 detects pressure fluctuations of the fluid owing to the Kármán vortexes, producing an electric signal. It is known in the art that the frequency of the produced electric signal, i.e., the number of Kármán vortexes shed per unit time, is expressed as follows:

$$F = K \cdot V / D \tag{1}$$

where V is the speed of the fluid flowing in the flow passage 14, D is the width of the rod 20, and K is a proportionality constant. If the cross-sectional area S of the flow passage 14 is known, then the flow rate Q of the fluid flowing in the flow passage 14 is determined from the above equation (1) as follows:

$$Q = V \cdot W = F \cdot D \cdot S / K \tag{2}$$

The data table stored in the memory 52 is generated on the basis of the equation (2).

The comparator 46 compares the electric signal from the piezoelectric device 22 with the reference voltage generated by the reference voltage source 47. When the electric signal from the piezoelectric device 22 is higher than the reference voltage, the comparator 46 outputs a signal representative of "1". When the electric signal from the piezoelectric device 22 is lower than the reference voltage, the comparator 46 outputs a signal representative of "0". Therefore, the electric signal from the piezoelectric device 22 is converted by the comparator 46 into a binary pulse signal which is applied to the CPU 48. In the CPU 48, the counter 50 counts clock pulses generated by the clock generator 49 in one pulse period of the pulse signal, and determines the period T of the pulse signal from the count and the period of the clock pulse. The CPU 48 then determines a flow rate Q (see FIG. 5) from the data table stored in the memory 52 based on the reciprocal 1/T of the period T, i.e., the frequency F of the pulse signal. For example, if the frequency F of the pulse signal is F1, then the flow rate is Q1. The CPU 48 displays the flow rate Q thus determined on the seven-segment LED 36.

Specifically, the counter 50 counts clock pulses generated by the clock generator 49 in the period of a plurality of pulses, i.e., n pulses, of the pulse signal, and the CPU 48 determines a period Tn of the n pulses from the count and the period of the clock pulse, and divides the period Tn by "n", producing an average period T of the pulse signal. The CPU 48 then determines a frequency F as the reciprocal of the average period T, and determines a corresponding flow rate Q from the frequency F by referring to the data table (see FIG. 5). Therefore, the flow rate Q can be determined highly accurately.

Thereafter, the CPU 48 compares the flow rate Q with the threshold values Qa, Qb, displays the results of the comparison on the LEDs 38a, 38b, and outputs them through the transistors 54a, 54b to the output terminals 56a, 56b. With respect to the threshold value Qa and the output terminal 56a, for example, if the flow rate Q is of a value Q1 which is smaller than the threshold value Qa as indicated by the broken line A in FIG. 5, then the CPU 48 turns off the LED 38a and also turns off the transistor 54a. Since no current flows through the load 58a at this time, the load 58a is de-energized. If the flow rate Q is of a value Q2 which is greater than the threshold value Qa as indicated by the broken line B in FIG. 5, then the CPU 48 turns on the LED 38a and also turns on the transistor 54a. A current flows from the power supply 60 through the load 58a and the transistor 54a, energizing the load 58a.

With respect to the threshold value Qb and the output terminal 56b, the load 58b connected to the output terminal 56b is controlled in the same manner as described above based on the result of a comparison between the flow rate Q and the threshold value Qb.

The flow rate is measured per given time, e.g., every one second. Therefore, the results of the comparison between the flow rate Q and the threshold values Qa, Qb are outputted to the LEDs 38a, 38b and the output terminals 56a, 56b in every one second.

Each of the loads 58a, 58b (external devices) may comprise a flow control valve, for example, for controlling the flow rate of the fluid. When the flow rate Q becomes greater than the threshold value Qa or Qb, the flow control valve is closed to reduce the flow rate Q. When the flow rate Q becomes smaller than the threshold value Qa or Qb, the flow control valve is opened to increase the flow rate Q. Such a flow control valve is used, for example, in an IC (integrated circuit) fabrication process in which it controls the flow rate of cooling water supplied into a wafer plate which supports a semiconductor wafer in a vacuum chamber for controlling the temperature of the semiconductor water.

A lamp or a buzzer may be connected to each of the loads 58a, 58b, and when the flow rate Q of the fluid supplied to the loads 58a, 58b used in combination with the flow rate detector 10 becomes greater or smaller than the threshold value Qa or Qb, the lamp or the buzzer may be turned on to indicate an abnormal condition of the loads 58a, 58b. In a specific example, the flow rate detector 10 may be connected to a drainage pipe for cooling water for cooling the electrode tip of a welding gun used for resistance welding, and when the electrode tip drops off, the fact that no cooling water flows through the drainage pipe is detected, turning on a lamp or a buzzer, indicating the dropping off of the electrode tip.

In the above first embodiment, as described above, a flow rate is measured by measuring periodic fluctuations produced by Kármán vortexes, and compared with predetermined flow rate data to turn on or off the loads 58a, 58b connected to the output terminals 56a, 56b. Therefore, it is possible to control an external device depending on the flow rate of the fluid flowing through the flow passage 14.

Figure 6:
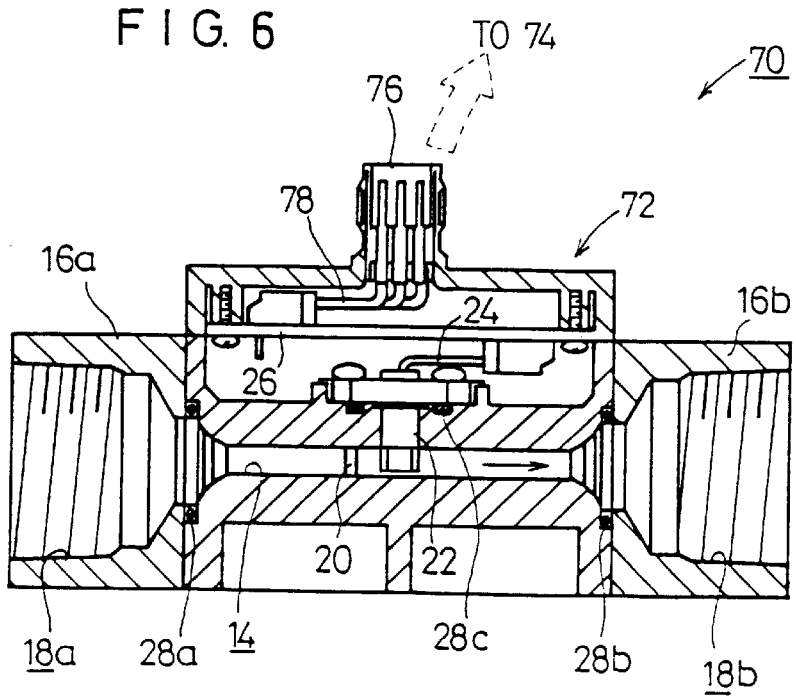
FIG. 6 is a longitudinal cross-sectional view of a flow rate detector according to a second embodiment of the present invention.
Figure 7:
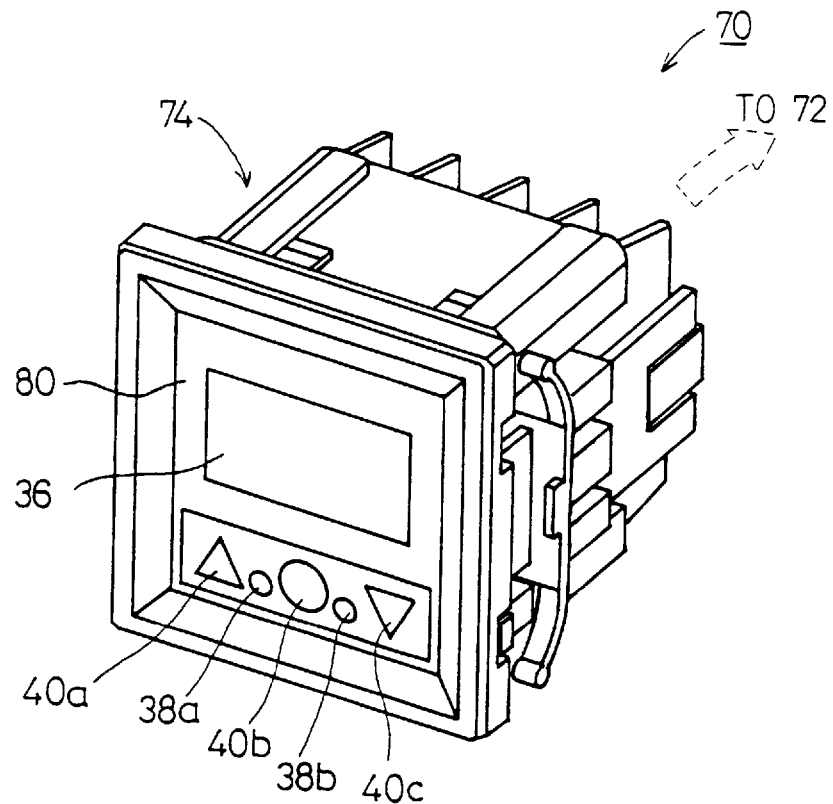
FIG. 7 is a perspective view of a display unit of the flow rate detector according to the second embodiment.
Figure 8:
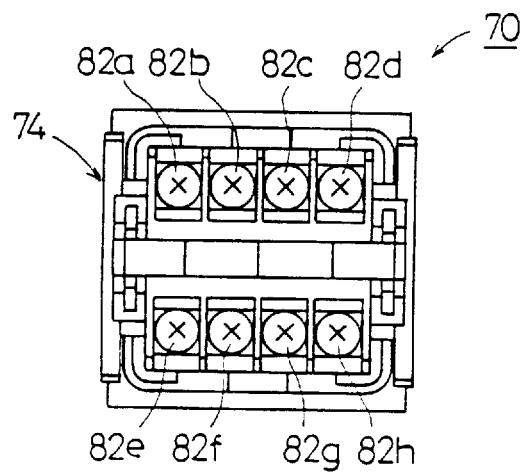
FIG. 8 is a rear elevational view of the display unit shown in FIG. 7.

FIGS. 6 through 8 show a flow rate detector 70 according to a second embodiment of the present invention. Only those details of the flow rate detector 70 which are different from those of the flow rate detector 10 according to the first embodiment will be described below. Those parts of the flow rate detector 70 which are identical to those of the flow rate detector 10 according to the first embodiment will not be described in detail below.

As shown in FIGS. 6 through 8, the flow rate detector 70 comprises a casing 72 and a display unit 74 separate from the casing 72. A circuit board 26 housed in the casing 72 is connected by leads 78 to a connector 76 mounted on an upper panel of the casing 72, and the connector 76 is connected to the display unit 74 by leads (not shown).

As shown in FIG. 7, the display unit 74 has a display panel 80 which supports a seven-segment LED 36, LEDs 38a, 38b, and setting switches 40a~40c. As shown in FIG. 8, terminals 82a~82h are mounted on a rear panel of the display unit 74, and the loads 58a, 58b shown in FIG. 4 and the connector 76 shown in FIG. 6 are connected to some of the terminals 82a~82h.

Since the display unit 74 can be installed in a position separate from the casing 72, it is easy to position the display unit 74 for easy visual recognition. For example, even if the casing 72 is placed in a location that cannot easily be accessible, the display unit 74 may be positioned remotely from the casing 72 for easy visual observation.

Figure 9:
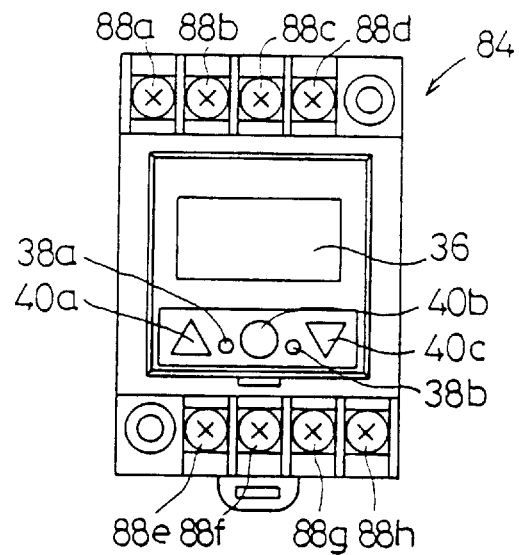
FIG. 9 is a plan view of a display unit of a flow rate detector according to a third embodiment of the present invention.
Figure 10:
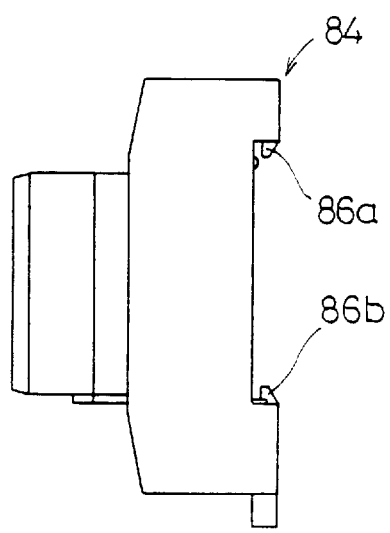
FIG. 10 is a side elevational view of the display unit shown in FIG. 9.

According to a third embodiment shown in FIGS. 9 and 10, a display unit 84 has a pair of engaging teeth 86a, 86b on its rear panel for mounting the display unit 84 on an elongate rail. The display unit 84 has terminals 88a~88h on a front panel thereof.

In the first and second embodiments, the loads 58a, 58b are energized when the flow rate Q of the fluid is greater than the threshold values Qa, Qb. However, the loads 58a, 58b may be energized when the flow rate Q of the fluid is smaller than the threshold values Qa, Qb.

In the first and second embodiments, a flow rate is measured per given time. However, flow rates determined per given time may be added into an integrated flow rate, the integrated flow rate may be displayed on the seven-segment LED 36, and given integrated flow rates may be established as threshold values. In this case, a measured integrated flow rate is compared with threshold values, and the results of the comparison are outputted to the output terminals 56a, 56b. When the fluid flows at rates established as the threshold values, the loads 58a, 58b connected to the output terminals 56a, 56b are energized or de-energized.

Figure 5:
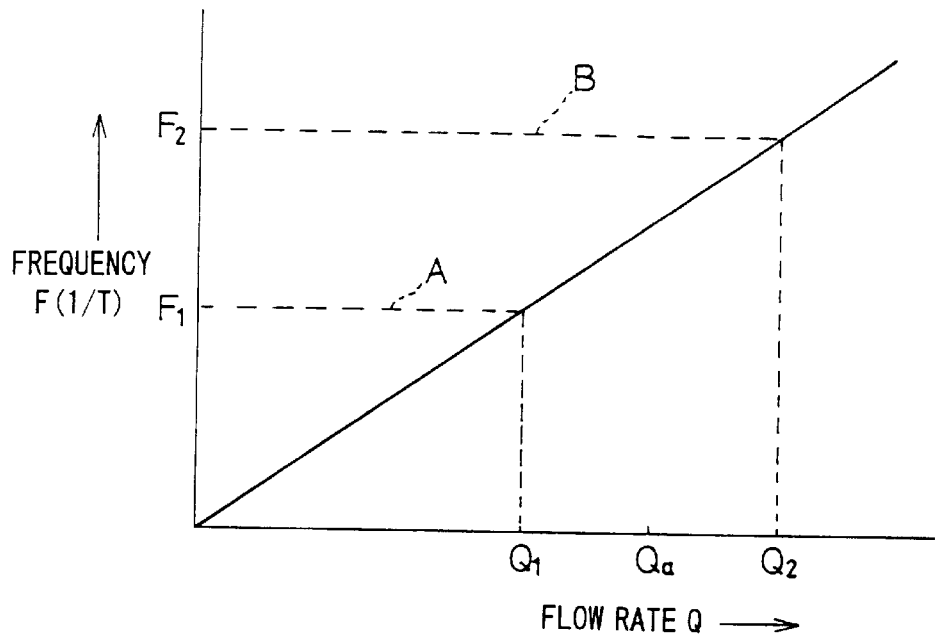
FIG. 5 is a graph showing the relationship between the flow rate of a fluid and the frequency of a pulse signal, indicated by a data table stored in a memory in the electric circuit shown in FIG. 4.
Figure 11:
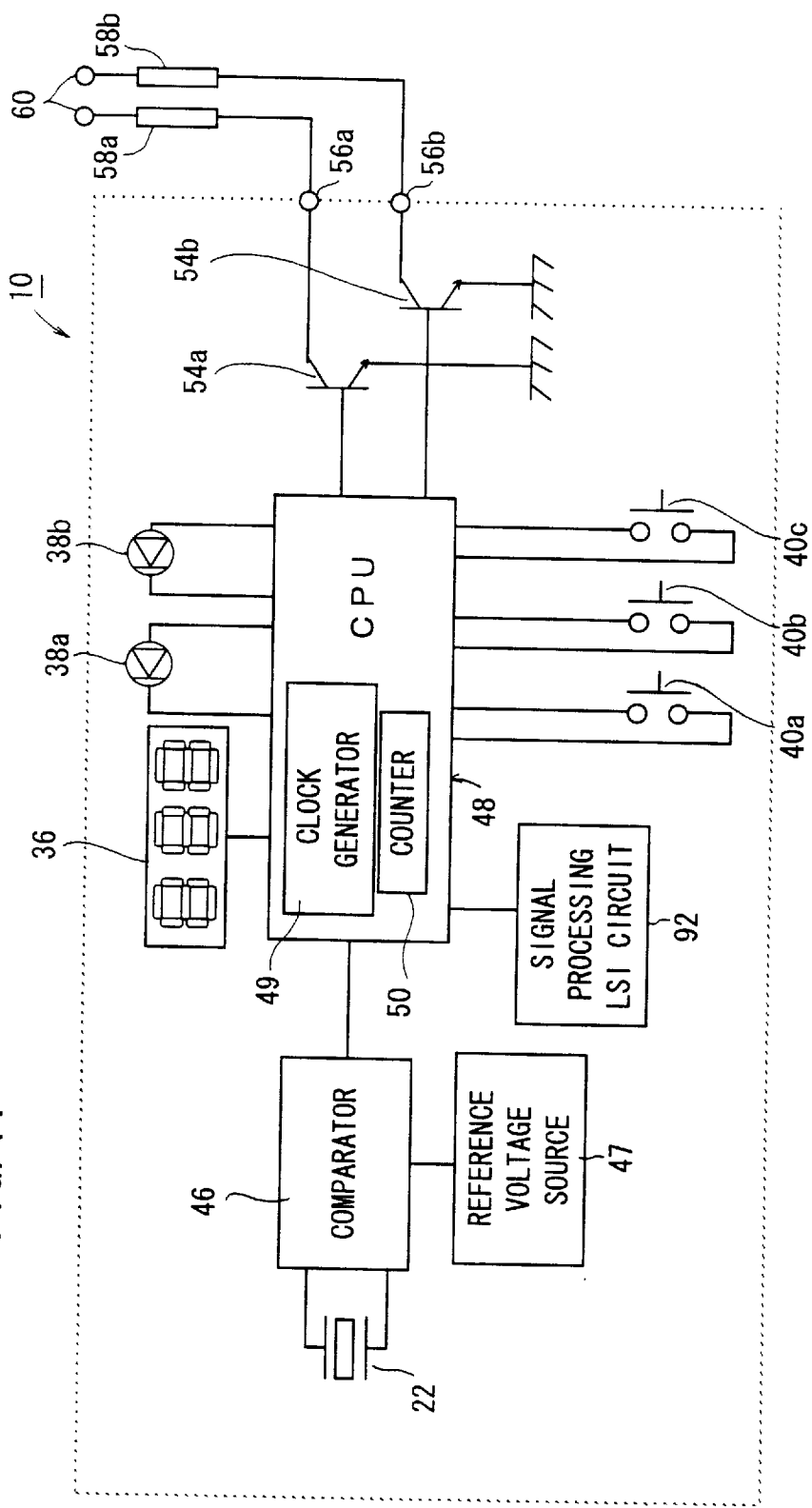
FIG. 11 is a block diagram of an electric circuit of a flow rate detector according to a fourth embodiment of the present invention.

The data table shown in FIG. 5 may not be used, but a flow rate may be calculated according to the equation (2). A flow rate may be calculated at a high speed using a signal processing LSI (large-scale integration) circuit 92 shown in FIG. 11 which illustrates in block diagram a flow rate detector according to a fourth embodiment of the present invention.

The number of the threshold values Qa, Qb may be varied depending on the number of desired output signals, and the number of the output terminals 56a, 56b may also be varied.

Although certain preferred embodiments of the present invention has been shown and described in detail, it should be understood that various changes and modifications may be made therein without departing from the scope of the appended claims.

What is claimed is:

1. A flow rate detector connected to a plurality of external devices comprising:

a flow passage for passage of a fluid therethrough:

a rod disposed in said flow passage;

a pressure sensor positioned downstream of said rod in said flow passage for measuring periodic fluctuations of Kármán vortexes shed in the fluid in said flow passage by said rod;

a reference voltage source for supplying a predetermined reference voltage;

comparator means for outputting a binary signal 1 when an output voltage from said pressure sensor exceeds said reference voltage and a binary signal 0 when said output voltage is lower than said reference voltage, thereby outputting a binary pulse signal;

display means for displaying a flow rate;

reference setting means for establishing a plurality of different reference flow rates corresponding to each of said external devices;

signal output means for outputting an electric signal to said external devices; and a processing circuit calculating said flow rate of the fluid from the periodic fluctuations measured by said pressure sensor and from period (T) of said pulse signal, displaying the calculated flow rate on said display means, comparing the calculated flow rate with the reference flow rates established by said reference setting means, converting the results of the comparisons into electric signals, and outputting the electric signals to said signal output means and to said respective external devices, thereby controlling said plurality of external devices based on the calculated flow rate in said flow passage.

2. A flow rate detector according to claim 1, wherein said processing circuit comprises means for calculating the flow rate according to the equation:

$$Q = F \cdot D \cdot S / K$$

where Q is the flow rate of the fluid flowing through said flow passage, F is the frequency of a signal outputted from said pressure sensor, D is the width of said rod, S is the cross-sectional area of said flow passage, and K is a proportionality constant.

3. A flow rate detector according to claim 1, wherein said processing circuit has a data table representative of the relationship between the frequency of a signal outputted from said pressure sensor and the flow rate of the fluid flowing through said flow passage, and comprises means for determining the flow rate by referring to said data table in response to the signal outputted from said pressure sensor.

4. A flow rate detector according to claim 1, wherein said pressure sensor comprises a piezoelectric device.

5. A flow rate detector according to claim 4, wherein said piezoelectric device has a thin cross-sectional shape extending longitudinally parallel to said flow passage.

6. A flow rate detector according to claim 5, wherein said piezoelectric device has wedge-shaped opposite ends spaced along said flow passage.

7. A flow rate detector according to claim 1, wherein said rod is disposed substantially centrally in said flow passage and extends perpendicularly to said flow passage, and said pressure sensor is spaced from said rod and disposed substantially centrally in said flow passage.

8. A flow rate detector according to claim 1, wherein said flow passage is of a substantially square cross-sectional shape.

9. A flow rate detector according to claim 1, wherein said rod is of a trapezoidal cross section and is oriented such that its longer side is positioned upstream in said flow passage and extends perpendicularly to the fluid flowing in said flow passage and its shorter side is positioned downstream in said flow passage.

10. A flow rate detector according to claim 1, further comprising a pair of transistors connected between said processing circuit and said signal output means, whereby said transistors can be selectively turned on and off by said processing circuit to selectively energize and de-energize external devices connected to said signal output means.

* * * * *